Jan. 17, 1956

B. CHANCE

DELAY CIRCUIT

Filed Dec. 27, 1945

2,731,571

INVENTOR
BRITTON CHANCE

BY [signature]

ATTORNEY

United States Patent Office 2,731,571

Patented Jan. 17, 1956

2,731,571

DELAY CIRCUIT

Britton Chance, Cambridge, Mass., assignor, by mesne assignments, to the United States of America as represented by the Secretary of the Navy Application December 27, 1945, Serial No. 637,507

3 Claims. (Cl. 307—88.5)

This invention relates to delay circuits, and more particularly, to stable delay circuits incorporating germanium crystal rectifiers as non-linear impedance elements.

A type of delay circuit in conventional use incorporates either a "pickoff" or a "clipping" diode electron discharge device connected in a circuit in such a way that it is caused to conduct current when a sawtooth voltage wave impressed upon the circuit rises above a predetermined amplitude. The potential difference across the diode required to cause conduction, as determined by a bias voltage impressed upon the diode, varies from cycle to cycle of the applied sawtooth wave because of the inherent noise voltages generated within the diode. The time interval between the start of the sawtooth wave and conduction of the diode therefore is variable, thus limiting the stability and accuracy of the delay circuit.

A low impedance load periodically coupled by a capacitor to a source of voltage causes the capacitor to assume an electrostatic charge. Conventional circuits in which such a charge is undesirable incorporate a "clamping" diode so connected electrically that the capacitor is discharged when the applied voltage falls below a predetermined amplitude. The clamping diode requires a source of cathode heater current, which, of course, requires an increase in the size and weight of the associated power supply.

It is an object of this invention to provide a delay circuit.

It is another object of this invention to provide a delay circuit with increased stability.

It is another object of this invention to provide a clamping circuit.

It is a further object of this invention to provide a clamping circuit for discharging, between alternate cycles, a capacitor connected between a voltage source and a low impedance load.

It is a still further object of this invention to provide a clamping circuit which does not require cathode heater current, for discharging between alternate cycles a capacitor connected between a voltage source and a low impedance load.

These and other objects will be more apparent upon consideration of the following description together with the accompanying drawings, in which.

Figure 1:
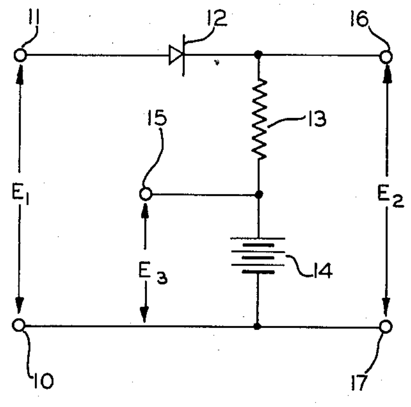
Fig. 1 is a schematic diagram of a circuit incorporating an embodiment of this invention.
Figure 2:
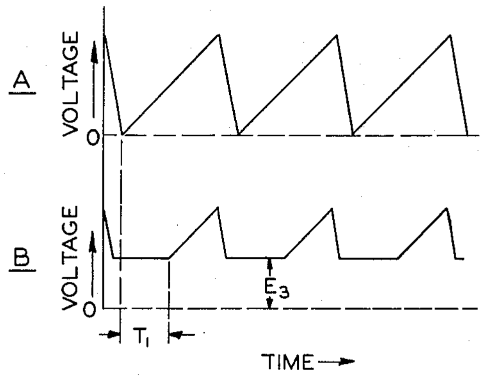
Fig. 2 is a graph of certain waveforms useful in explaining the operation of the apparatus of Fig. 1.

With particular reference to Fig. 1 which illustrates a "pickoff" application of the invention, a sawtooth voltage wave $E_1$, shown in curve A of Fig. 2, is impressed across input terminals 10 and 11. Germanium crystal 12 is connected between terminals 11 and 16. Terminals 15 and 16 are biased by a voltage source 14 to a voltage $E_3$, positive with respect to terminals 10 and 17, in the absence of current passed by crystal 12. The germanium crystal 12, because of its non-linear impedance characteristics, appears as a high resistance in series with terminals 11 and 16 until the input voltage $E_1$ reaches an amplitude approximately equal to the aforementioned bias voltage $E_3$, after which it appears as a low resistance. Resistor 13 is connected between terminals 15 and 16 to electrically isolate these terminals when crystal 12 conducts current. The voltage $E_2$ appearing across terminals 16 and 17 has a waveform as shown in curve B of Fig. 2. A time delay $T_1$ is thus introduced between the start of the input sawtooth voltage wave $E_1$ and the start of the output voltage wave $E_2$ as shown in Fig. 2.

Figure 3:
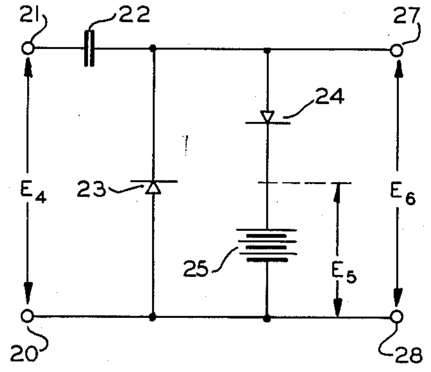
Fig. 3 is a schematic diagram of a circuit incorporating another embodiment of this invention.
Figure 4:
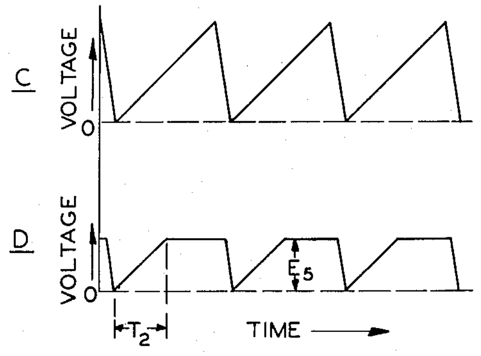
Fig. 4 is a graph of certain waveforms useful in explaining the operation of the apparatus of Fig. 3.

With reference to Fig. 3 which illustrates "clipping" and "clamping" applications of the invention, a sawtooth voltage wave $E_4$, shown as curve C of Fig. 4, impressed across input terminals 20 and 21 is coupled to output terminals 27 and 28 by coupling capacitor 22. A bias voltage $E_5$ is applied to germanium crystal 24 by means of a voltage source 25 connected in series with crystal 24 and output terminals 27 and 28. When the input voltage $E_4$ exceeds the bias voltage $E_5$, the resistance of crystal 24 decreases, causing the coupling capacitor 22 to assume an electrostatic charge. When the input voltage $E_4$ suddenly becomes more negative, the resistance of germanium crystal 23, which is connected across output terminals 27 and 28 decreases, discharging capacitor 22. The output voltage $E_6$ appearing across terminals 27 and 28 thus has a waveform as shown in curve D of Fig. 4, introducing a time delay $T_2$.

Because of the low intensity of inherent thermal noise generated within the germanium crystals as compared with that generated within diodes, the point of conduction, or point of change of resistance is more sharply defined than that of diodes, thereby resulting in increased stability and accuracy of the delay circuit.

While the use of germanium crystals has been specifically described in terms of clipping, clamping, and pick-off functions in delay circuits, it will be apparent to those skilled in the art that they may be used in any electronic application requiring pick-off diodes, or clamping or clipping circuits.

Since certain changes may be made in the above-described embodiments of the invention without departing from the scope thereof, it is intended that all matter contained in the above description or shown in the accompanying drawings be taken in an illustrative and not in a limiting sense, and therefore that the invention is to be limited only by the prior art and the spirit of the appended claims.

What is claimed is:

1. A delay circuit comprising, first and second input terminals, first and second output terminals, a coupling capacitor connected between said first input terminal and said first output terminals, said second input and second output terminals being connected together, a first germanium crystal connected between said first and second output terminals in such a way that said first crystal conducts current readily when a voltage impressed across said first and second input terminals causes said first output terminal to be at a negative potential with respect to said second output terminal, a second germanium crystal and a bias voltage source connected in series across said first and second output terminals, said second germanium crystal being so connected that it conducts current readily when a voltage impressed across said first and second input terminals causes said first output terminal to be at a positive potential, exceeding said bias voltage, with respect to said second output terminal.

2. A circuit comprising first and second input terminals and first and second output terminals, a capacitor connected between said first input terminal and said first output terminal, said second input and output terminals being connected together, a first germanium crystal connected to conduct current from said second input terminal to said first output terminal, a second germanium crystal and a bias voltage source connected in series between said first and second output terminals, said germanium crystal being connected to conduct current from said first output terminal to said second output terminal when a voltage impressed across said input terminals causes said first output to be at a positive potential, exceeding said bias voltage, with respect to said second output terminal.

3. A circuit having first and second input terminals and first and second output terminals, a capacitor connected between said first input terminal and said first output terminal, said second input terminal and said second output terminal being connected together, a first germanium crystal and a source of biasing voltage connected in series between said first output terminal and said second output terminal, and a second germanium crystal connected oppositely of said first crystal from said first input terminal to said first output terminal in parallel with said first crystal and said voltage source.

References Cited in the file of this patent

UNITED STATES PATENTS

| | | |
|---|---|---|
| 2,227,050 | White et al. | Dec. 31, 1940 |
| 2,418,480 | Pritchard et al. | Apr. 8, 1947 |

OTHER REFERENCES

Ultra-High Frequency Techniques, Brainerd et al., pages 179–180; published July 1942 by D. Van Nostrand Co., Inc.

On Contact Rectification by Metallic Germanium, E. Merritt Proc. Nat'l. Academy of Sciences, vol. II, 1925, pp. 743–748 (Copy in Bu. Standards Library.)